(12) United States Patent
Ahlgren

(10) Patent No.: US 6,265,731 B1
(45) Date of Patent: Jul. 24, 2001

(54) OHMIC CONTACTS FOR P-TYPE WIDE BANDGAP II-VI SEMICONDUCTOR MATERIALS

(75) Inventor: William L. Ahlgren, Goleta, CA (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 07/893,159

(22) Filed: Jun. 3, 1992

(51) Int. Cl.[7] .................. H01L 29/22; H01L 31/0256; H01L 31/0296; H01L 23/48
(52) U.S. Cl. .................. 257/78; 257/744; 257/461
(58) Field of Search .................. 251/774, 461, 251/78

(56) References Cited

U.S. PATENT DOCUMENTS

| 4,319,069 | * | 3/1982 | Tyan | 257/78 |
| 4,710,786 | * | 12/1987 | Ovshinsky | 357/2 |
| 4,801,984 | * | 1/1989 | Woodall | 357/16 |
| 5,045,897 | * | 9/1991 | Ahlgren | 357/17 |

OTHER PUBLICATIONS

Best et al, "HgSe, . . . contact for semiconductor . . . " Appl Phys Lttr Vol 29 #7, pp. 1133–1134, 1976.*

* cited by examiner

*Primary Examiner*—Stephen D. Meier
(74) *Attorney, Agent, or Firm*—W. C. Schubert; G. H. Lenzen, Jr.

(57) ABSTRACT

A semiconductor device comprises an active element and contacts that permit low-resistance external electrical connections. The active element includes an active layer formed from group II–VI elements, an n-doped layer on one side of the active it layer, and a p-doped layer on the other side of the active layer. The p-doped layer is a ZnSe-based alloy or a ZnTe-based alloy. There are electrical contacts to the n-doped layer and to the p-doped layer. The electrical contact to the p-doped layer includes a graded-alloy contact layer in epitaxial contact with the p-doped layer and whose bandgap varies from about that of the p-doped layer adjacent the p-doped layer to about zero at a location remote from the p-doped layer. The graded-alloy contact layer is a HgZnSSe-based graded-composition alloy where the p-doped layer is a ZnSe-based alloy, or a HgZnSeTe-based graded-composition alloy where the p-doped layer is a ZnTe-based alloy.

20 Claims, 3 Drawing Sheets

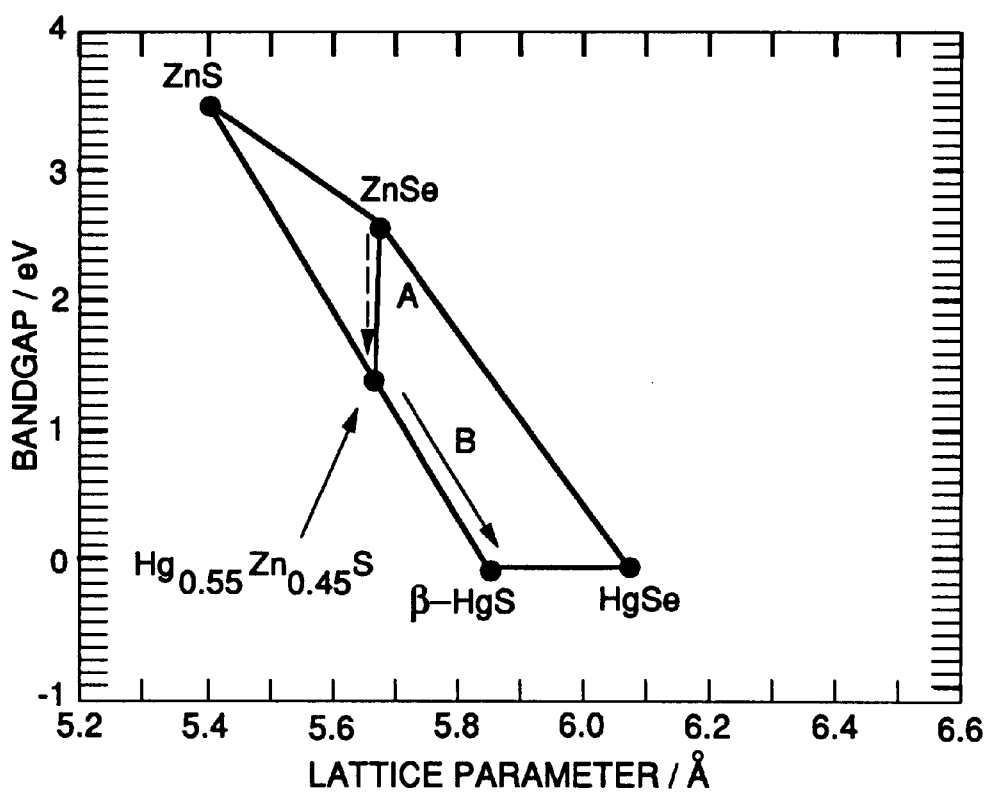
FIG. 3.
FIG. 4.
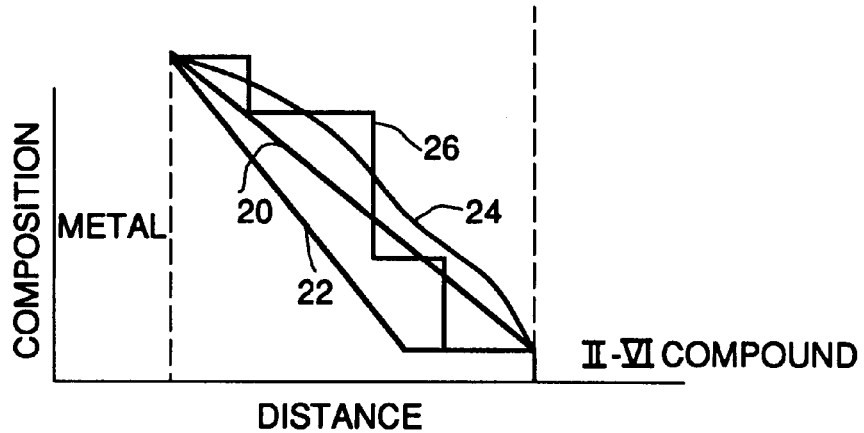

OHMIC CONTACTS FOR P-TYPE WIDE BANDGAP II-VI SEMICONDUCTOR MATERIALS

BACKGROUND OF THE INVENTION

This invention relates to semiconductor electronic devices, and, more particularly, to an approach for making low-electrical-resistance contacts to such devices.

A semiconductor device requires external connections from the semiconductor elements to wires, leads, or other metallic conductors which connect the semiconductor elements to other parts of a circuit. The semiconductors and the metallic conductors have fundamentally different electronic structures and electronic conduction mechanisms. The result of the different conduction mechanisms is the presence of a contact potential and energy barrier when the semiconductor is placed into contact with the metal. The contact potential adds a contact resistance to the flow of electrons in the circuit, which may be substantial and adversely affect the operation of the semiconductor device and the circuit containing the device. It is therefore usually desirable to reduce the contact resistance between the semiconductor and the metal to as low a value as possible.

An ohmic contact between a semiconductor and a metal is one where the contact resistance is a independent of the direction of current flow and is negligibly small. While ohmic contacts are readily created in a number of instances, in others such contacts are made only with difficulty. It is often difficult to make a satisfactory ohmic or near-ohmic contact to a wide bandgap semiconductor, because metals typically do not have a sufficiently small work function that leads to a small energy barrier.

The II–VI semiconductor materials include those based on ZnSe, ZnTe, and alloys derived from these compounds, often with additional elements such as mercury, cadmium, or magnesium from Group II of the periodic table, manganese from Group VII, or sulfur, selenium, or tellurium from Group VI. Some of these semiconductor materials are of significant commercial interest for use in the preparation of short wavelength diode lasers, as an example. These II–VI semiconductors exhibit relatively wide bandgaps of more than 2 electron volts. It is therefore difficult to form ohmic contacts to p-type semiconductor materials of this family, and in some cases no satisfactory ohmic contact structures are known. In those instances, the full potential of the II–VI semiconductor devices cannot be reached.

There is a need for an approach for achieving ohmic contacts to II–VI semiconductors such as ZnSe, ZnTe, their alloys, and doped structures based upon these materials. The present invention fulfills this need, and further provides related advantages.

SUMMARY OF THE INVENTION

The present invention provides an approach for making ohmic contacts to p-type, wide bandgap II–VI semiconductor materials such as ZnSe, ZnTe, and their alloys. The ohmic contacts retain an epitaxial relation to the semiconductor, while providing a negligible energy barrier in the metal-semiconductor interface region. The ohmic contacts may be formed with existing equipment, and in a controlled manner.

In accordance with the invention, a device is made with a metal-semiconductor ohmic contact. The device comprises a p-doped layer made from a ZnSe-, or ZnTe-based alloy. There is further provided means for making electrical contact to the p-doped layer, the means including a graded-alloy contact layer in epitaxial contact with the p-doped layer and whose bandgap varies from about that of the p-doped layer adjacent the p-doped layer to about zero at a location remote from the p-doped layer. The graded-alloy contact layer is preferably formed from either a HgZnSSe-based graded-composition alloy where the p-doped layer is a ZnSe-based alloy, or a HgZnSeTe-based graded-composition alloy where the p-doped layer is a ZnTe-based alloy.

In an important application of this approach, an active element is also provided in the device. Such a device comprises an active element including an active layer formed from group II–VI elements, an n-doped layer on one side of the active layer, and a p-doped layer on the other side of the active layer. The p-doped layer is a ZnSe-based alloy, or a ZnTe-based alloy. There is an electrical contact to the n-doped layer. There Is also means for making electrical contact to the p-doped layer, the means including a graded-alloy contact layer in epitaxial contact with the p-doped layer and whose bandgap varies from about that of the p-doped layer adjacent the p-doped layer to about zero at a location remote from the p-doped layer. The graded-alloy contact layer is preferably formed from a HgZnSSe-based graded-composition alloy where the p-doped layer is a ZnSe-based alloy, or a HgZnSeTe-based graded-composition alloy where the p-doped layer is a ZnTe-based alloy.

The graded-composition approach of the invention thus provides mercury-containing complex alloys that can be gradually changed in composition over the thickness of the contact layer to vary the bandgap from that of the II–VI semiconductor to that of the metal (zero). This gradation can be made while maintaining the lattice structure and lattice parameter of the graded-composition alloys unchanged and the same as that of the II–VI semiconductor material, at least near to the interface with the II–VI semiconductor material. An epitaxial relation is thereby retained.

The present invention is an important advance in the art of semiconductor devices, because it enables the practical use of II–VI semiconductor devices such as risible and infrared laser diodes. Other features and advantages of the invention will be apparent from the following more detailed description of the preferred embodiments, taken in conjunction with the accompanying drawings, which illustrate, by way of example, the principles of the invention.

BRIEF DESCRIPTION OF THE DRAWINGS

FIG. 3 is a graph of bandgap versus lattice parameter, illustrating the relation of bandgap and lattice parameter of the intermediate layer placed between ZnSe and beta-HgS;

FIG. 4 is a schematic graph of various permissible variations of composition as a function of distance in the graded-alloy contact layer;

DETAILED DESCRIPTION OF THE INVENTION

Figure 1:
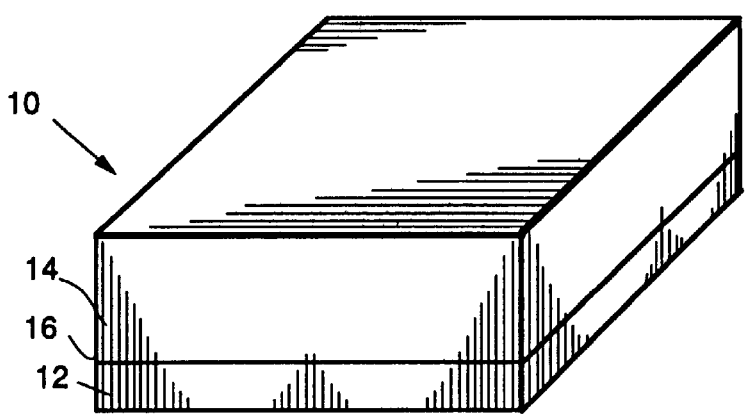
FIG. 1 is a schematic perspective view of a semiconductor device (not drawn to scale)

FIG. 1 illustrates a device 10 incorporating a p-doped layer 12 of a II–VI semiconductor material, to which ohmic contact is to be made. The layer 12 is preferably formed of a ZnSe-based alloy or a ZnTe-based alloy. As used herein, an "X-based alloy", where X is a II–VI semiconductor that will be apparent from the context, is the II–VI semiconductor itself (i.e., or the II–VI semiconductor alloyed with at least one other element such as, for example, Mg, Cd, or Hg from Group II, Mn from Group VII, or S, Se, or Te from Group VI. Any such alloy must retain the characteristics of a II–VI semiconductor.

A graded-alloy layer 14 epitaxially contacts the p-doped layer 12. (In a practical device, additional layers, including metallization contact layers, are usually present, as will be discussed in relation to FIG. 6.) At an interface 16 between the layers 12 and 14, the graded-alloy layer 14 has a crystal structure and orientation identical to that of the p-doped layer 12 and a crystalline lattice parameter substantially identical to that of the p-doped layer 12. A "substantially identical lattice parameter" is one that permits epitaxial lattice continuity between two contacting crystalline structures. In most cases, the lattice parameters of epitaxially related structures are identical or within about 0.5 percent of each other.

The graded-alloy 14 preferably has a composition that is substantially Identical to that of the p-doped layer 12 at the Interface 16 between the layers 12 and 14. The identity of composition ensures that the bandgap and electron affinity of the graded-alloy layer 14 are identical to those of the p-doped layer 12 at the interface 16. There is therefore no barrier in either the conduction or the valence bands at the interface 16. The identity of composition also ensures that the crystal structures and lattice parameters of the layers 12 and 14 will be the same. With care in deposition of the layers 12 and 14 in the manner well known in the art, the layers 12 and 14 will be in epitaxial contact at the interface 16.

Figure 2:
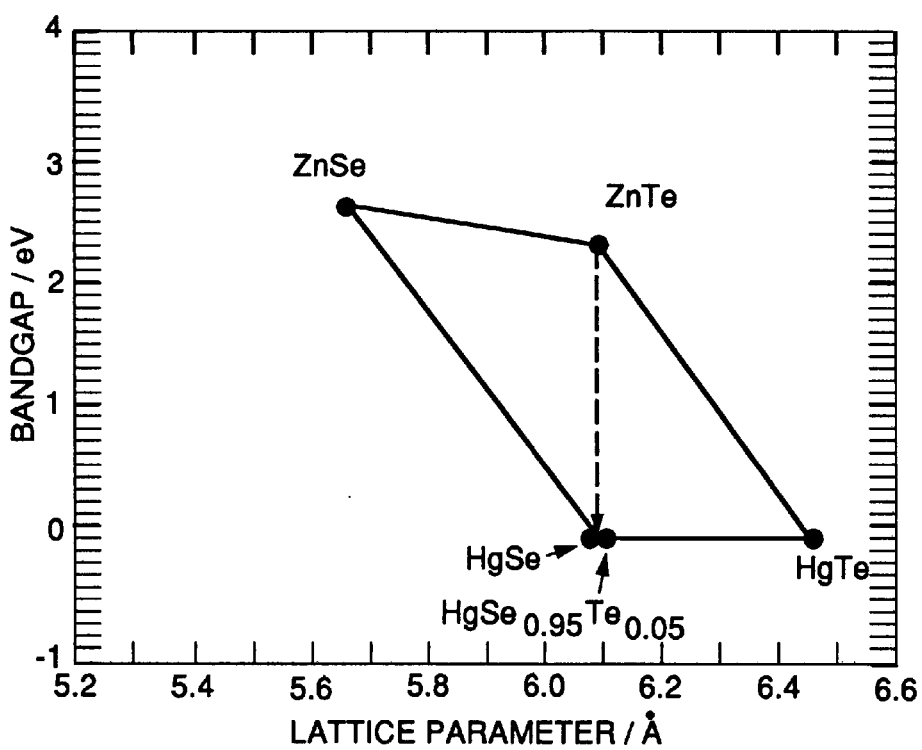
FIG. 2 is a graph of bandgap versus lattice parameter, illustrating the relation of bandgap and lattice parameter of the intermediate layer placed between ZnTe and HgSe.

The composition of the graded-alloy layer 14 is varied as a function of distance from the interface 16. The nature of the variation depends upon the material selected for the p-type layer 12. If the layer 12 is ZnTe, the layer 14 is selected to be an Hg Zn Se Te graded-composition alloy in which the Hg and Se contents approach zero at the interface 16. Thus, as shown in FIG. 2, the bandgap in both the layer 12 and the layer 14 is about 2.26 eV at the interface 16. With increasing distance from the interface 16, the Hg content and Se contents are increased, while the Zn and Te contents are decreased. At a location sufficiently remote from the interface 16, the Zn content of the graded-alloy layer 14 is reduced to zero, so that the local composition of the graded-alloy layer 14 is HgSe$_{0.95}$Te$_{0.05}$ which has a bandgap of zero and a lattice parameter approximately equal to that of ZnTe. The variation in alloy composition x and y can be accomplished with substantially no change in lattice parameter, while the bandgap is reduced from 2.26 ev to zero, as may be seen in FIG. 2. The lattice parameter of ZnTe is 6.101 Angstroms and that of HgSe$_{0.95}$Te$_{0.05}$ is the same. The epitaxial relation between the layers 12 and 14 at the interface 16 is readily maintained, and the introduction of misfit dislocations or other lattice defects is minimized.

If the layer 12 is ZnSe, the layer 14 is a Hg$_{1-x}$Zn$_x$S$_{1-y}$Se$_y$ graded-composition alloy. At the interface 16, the Hg and S contents approach zero, so that the layers 12 and 14 have substantially identical bandgaps of 2.64 eV. With increasing distance from the interface 16 in the graded-alloy layer 14, there are two regions of variation. At distances closest to the interface 16, the fraction of Zn is reduced and the fraction of Hg is increased, and the fraction of Se is reduced and the fraction of S increased, following path A in FIG. 3. These variations occur with the constraint that the lattice parameter of the graded-alloy layer 14 is maintained substantially constant at about 5.668 Angstroms (the lattice parameter of ZnSe) and the local bandgap of the layer 14 is reduced to about 1.48 eV at a layer composition of about x –0.45 and y=0 (i.e., Hg$_{0.55}$Zn$_{0.45}$S). At this distance from the interface 16, the variation of the ratios of Hg/Zn and S/Se are changed so that the local lattice parameter of the layer 14 is gradually increased to 5.851 Angstroms, following path B in FIG. 3. At the end of path B the local composition of the layer 14 is that of beta-HgS, which has a bandgap of zero.

If the layer 12 is an alloy, such as ZnSSe lattice-matched to GaAs or GaP, or ZnSeTe lattice-matched to InP or GaSb, a similar procedure is followed to produce a graded composition contact layer 14, but the paths followed in FIGS. 2 or 3 are altered appropriately.

The preceding discussion has provided guidelines for varying the composition of the graded-alloy layer 14, in terms of boundary values to be achieved and constraints to be satisfied during the variation. The form of the variation as a function of distance will depend upon the compositions required to meet the boundary values and satisfy the constraints. FIG. 4 schematically illustrates some possible composition profiles as a function of distance in the layer 14. A straight line profile 20 is usually found to be sufficient and is preferred. In some cases, the composition of the layer 14 is constant for some distance into the layer 14, and then is varied, see the profile 22. In other instances, a composition 24 that is nonlinear throughout all or part of the width of the layer 14 may be suitable. It may even be sufficient that the composition varies as a step function, numeral 26, which creates an interface within the layer 14 that will have its own valence and conduction band barriers. However, the magnitude of these barriers is greatly reduced.

Figure 5A:
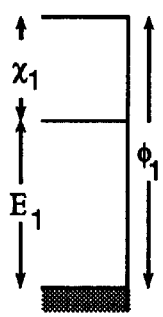
FIG. 5 is a set of energy band diagrams, illustrating in FIG. 5(a) the energy band of a wide-bandgap material in isolation, in FIG. 5(b) the energy band of a zero-bandgap material in isolation, in FIG. 5(c) the energy bands when the wide-bandgap and the zero-bandgap materials are contacted together, and in FIG. 5(d) the energy bands when the wide-bandgap and the zero-bandgap materials are contacted together, with an intermediate-bandgap layer placed between the two materials.
Figure 5B:
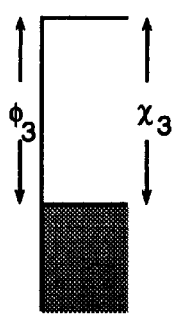
Figure 5C:
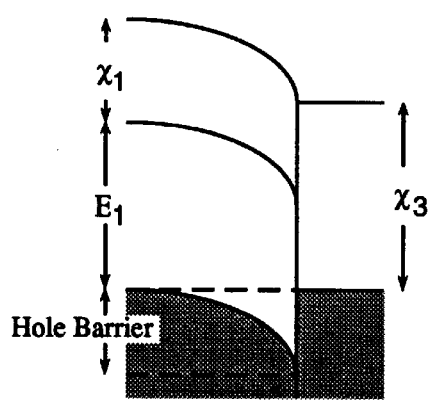
Figure 5D:
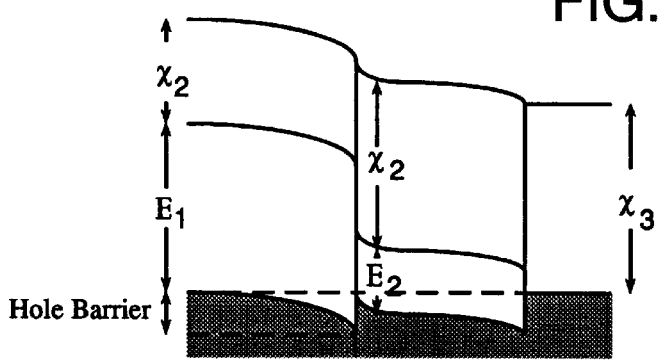

The basis for the reduction in the barriers has been discussed in the scientific literature, see, for example, W. G. Oldham and A. G. Milnes "n-n Semiconductor Heterojunctions," *Solid-State Electronics*, vol. 6, pages 121–132 (1966), D. T. Cheung, S. Y. Chiang, and G. L. Pearson, "A Simplified Model for Graded-Gap Heterojunctions," *Solid-State Electronics*, vol. 18, pages 263–266 (1966); and R. M. Raymond and R. E. Hayes, "Barrier Height Reduction for Graded n-n Heterojunctions," *J. Appl. Phys.*, vol. 48, pages 1359–1360 (1977). The basic idea is illustrated in FIGS. 5(a)–(d), as depicted for an exemplary case. FIG. 5(a) depicts the energy band diagram for a heavily doped p-type wide-bandgap layer such as ZnSe, and FIG. 5(b) depicts the energy band diagram for a p-type zero-bandgap layer such as beta-HgS, prior to contacting the two layers together. FIG. 5(c) is the corresponding diagram where the two layers are placed directly into contact, with a large barrier to hole injection from the zero-gap side to the wide-gap side. When an intermediate layer of intermediate bandgap is inserted between the zero-bandgap and the wide-bandgap materials, as illustrated in FIG. 5(d), the intermediate layer lowers the internal valence and conduction band barriers. By stepping (or, in the limit, grading) through a series of reduced bandgap compositions, the barriers can be made arbitrarily small. The final zero-bandgap material may be contacted with a metal contact material. As discussed previously, the intermediate layer or layers should be selected so as to maintain the epitaxial lattice match between the layers, insofar as possible. The present approach permits both the reduction of the internal electronic barriers and the satisfaction of this condition.

In some instances it may not be necessary for the final composition of the graded layer 14 to correspond to zero bandgap. It is only necessary that the bandgap is reduced sufficiently so that the energy barrier in the valence band is sufficiently small and/or the carrier concentration is sufficiently high to give a narrow space charge region through which tunneling can occur with high efficiency.

Figure 6:
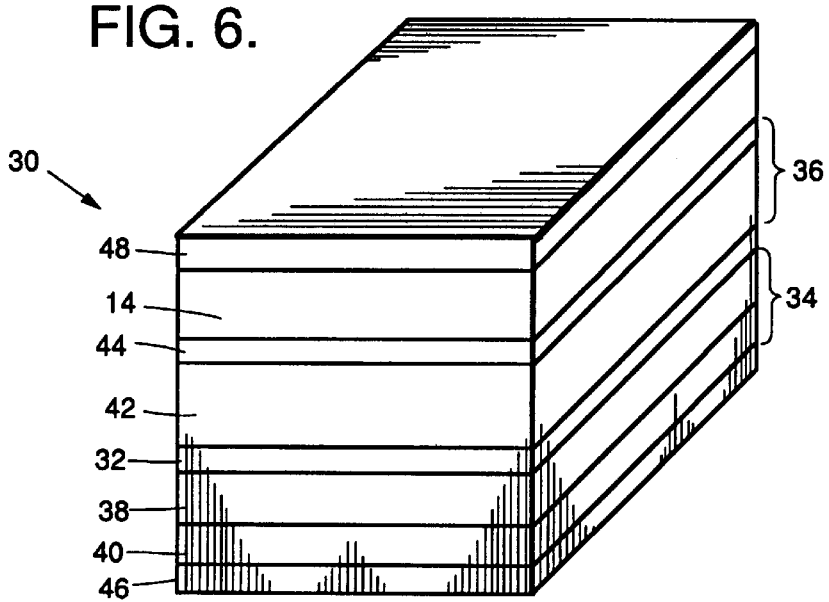
FIG. 6 is a schematic perspective view of a semiconductor device utilizing an active element (not drawn to scale).

FIG. 1 illustrates a basic form of semiconductor device utilizing the approach of the invention. A more complex device, in this case a double heterostructure laser diode 30. Is depicted in FIG. 6. The laser diode 30 Is based upon an active element layer 32 formed from group II–VI elements, an n-doped layer 34 on one side of the active element 32, and a p-doped layer 36 on the other side of the active element layer 32. This core structure is like that described in U.S. Pat. No. 5,045,897, whose disclosure is incorporated by reference.

The active element layer 32 Is an intrinsic II–VI active material. Examples of operable materials Include HgZnSSe or HgZnSeTe alloys discussed in the '897 patent, but may also Include materials such as ZnCdS and ZnCdSe or other II–VI alloys as described previously. In this case, the active element layer 32 Is a photonically active material that emits light when excited. In a variation of this device, the active element layer 32 may itself be internally structured, such as with a quantum well, superlattice, graded layer, or other structure.

In the preferred form of the invention, the n-doped layer 34 is fabricated as two layers, an n-type wide bandgap II–VI contact layer 38 adjacent to the active element layer 32 and an n+-type wide N bandgap II–VI cladding layer 40 remote from the active element layer 32. The layers 38 and 40 are made of a wide bandgap II–VI material, such as ZnSe, ZnTe, or alloys thereof. The n+-doped layer 40 is doped to the highest possible dopant level. The n-doped layer 38 may be doped to the same or a lower dopant level. N-type doping may be accomplished with iodine or chlorine.

The p-doped layer 36 is similar in function to the layer 12 of FIG. 1, and may have the same structure or may be formed as sublayers. In the preferred approach, the p-doped layer 36 includes a p-type wide bandgap II–VI contact layer 42 adjacent to the active element 32 and an p+-type wide bandgap II–VI cladding layer 44. The layers 42 and 44 are made of a wide bandgap II–VI material, such as ZnSe, ZnTe, or alloys thereof. The p+-doped layer 42 is doped to the highest possible dopant level. The p-doped layer 44 may be doped to the same or a lower dopant level. P-type doping may be accomplished with nitrogen.

Adjacent to the p-doped layer 36 is the graded-alloy layer 14. The structure, composition, and rules for variation of the composition of the layer 14 of FIG. 3 are the same as those for those of the layer 14 discussed in relation to FIG. 1.

Contact to the n-doped layer 34 is made with an n-side metal layer 46. The layer 46 is a low work function metal such as indium, aluminum, cadmium, lead, or titanium.

Contact to the graded-alloy layer 14 is made with a p-side metal layer 48. The layer 48 is a high work function metal such as gold, platinum, nickel, palladium, or iridium.

The entire device structure may be supported on a substrate, such as ZnSe, ZnTe, GaAs, GaSb, InP, GaP, Si, sapphire, or combinations of these materials, as described in the '897 patent.

The various layers 32, 34, 36, 46, and 48 are fabricated by conventional deposition procedures that are well known in the art. Operable techniques for the semiconductor phases 32, 34, and 36 include metalorganic chemical vapor deposition (MOCVD), photo-assisted metalorganic chemical vapor deposition (PAMOCVD), molecular beam epitaxy (MBE). metalorganic molecular beam epitaxy (MOMBE), and vapor phase epitaxy (VPE). The metallic phases 46 and 48 are deposited by evaporation of the metallic species from a source.

The graded-alloy layer 14 must be fabricated with care because of the need to vary the composition in the manner discussed previously. The actual method for achieving these variations will be apparent to those skilled in specific epitaxial growth arts. For example, In the MOCVD technique, variations of the flow rates of Hg, Zn, S, Se, or Te-bearing organometallic reactants is readily accomplished by controlling the mass flow of a carrier gas (usually hydrogen) through a bubbler at a fixed temperature and pressure. The relative flows of the reactants in turn determine the composition of the deposited layer.

The approach of the invention provides an approach, device, and method for achieving low resistance ohmic contacts between an external circuit and a p-doped layer of II–VI semiconductor material. Although particular embodiments of the invention have been described in detail for purposes of illustration, various modifications may be made without departing from the spirit and scope of the invention. Accordingly, the invention is not to be limited except as by the appended claims.

What is claimed is:

1. A device, comprising:
    an active element including an active layer formed from group II–VI elements, an n-doped layer on one side of the active layer and a p-doped layer on the other side of the active layer, the p-doped layer having a composition selected from the group consisting of (1) a ZnSe-based alloy and (ii) a ZnTe-based alloy;
    means for making electrical contact to the n-doped layer; and
    means for making electrical contact to the p-doped layer, the means including a graded-alloy contact layer in epitaxial contact with the p-doped layer and whose bandgap varies from about that of the p-doped layer adjacent the p-doped layer to about zero at a location remote from the p-doped layer, the graded-alloy contact layer being formed from an alloy selected from the group consisting of (i) a HgZnSSe-based graded-composition alloy having a composition of $Hg_{1-x} Zn_x S_{1-y} Se_y$, where the p-doped layer is a ZnSe-based alloy and (ii) a HgZnSeTe-based graded-composition alloy having a composition of $Hg_{1-x} Zn_x Se_{1-y} Te_y$, where the p-doped layer is a ZnTe-based alloy, where, in each case, x and y each vary an amount within the range 0 to 1 inclusive between a location adjacent the p-doped layer and a location remote from the p-doped layer.

2. The device of claim 1, wherein the n-doped layer comprises,
    an n-type wide-bandgap cladding layer adjacent the active layer, and
    an n+-type wide-bandgap contact layer adjacent the cladding layer.

3. The device of claim 1, wherein the means for making electrical contact to the n-doped layer comprises a layer of a low work function metal.

4. The device of claim 3, wherein the low work function metal is selected from the group consisting of indium, aluminum, cadmium, lead, and titanium.

5. The device of claim 1, wherein the p-doped layer comprises
   a p-type wide-bandgap cladding layer adjacent the active layer; and
   a p-type wide-bandgap contact layer adjacent the cladding layer.

6. The device of claim 1, wherein the means for making electrical contact to the p-doped layer further comprises
   a layer of a high work function metal in contact with the graded alloy contact layer.

7. The device of claim 6, wherein the high work function metal is selected from the group consisting of gold, platinum, nickel, palladium, and iridium.

8. The device of claim 1, wherein the p-doped layer is a ZnSe-based alloy and the graded-alloy contact layer is a HgZnSSe-based graded-composition alloy.

9. The device of claim 1, wherein the m p-doped layer is a ZnTe-based alloy and the graded-composition alloy.

10. The device of claim 1, wherein the p-doped layer further includes at least one element selected from the group consisting of a Group II element, a Group VI element, and a Group VII element.

11. The device of claim 1, wherein the active layer is photonically active.

12. A device, comprising:
   an active element including an active layer formed from group II–VI elements, an n-doped layer on one side of the active layer and a p-doped layer on the other side of the active layer, the p-doped layer having a composition selected from the group consisting of a ZnSe-based alloy, and a ZnTe-based alloy;
   means for making electrical contact to the n-doped layer; and
   means for making electrical contact to the p-doped layer, the means including a graded-alloy contact layer in epitaxial contact with the p-doped layer and whose bandgap varies from about that of the p-doped layer adjacent the p-doped layer to about zero at a location remote from the p-doped layer, the graded-alloy contact layer being formed from an alloy selected from the group consisting of
   a HgZnSSe-based graded-composition alloy having a composition of $Hg_{1-x} Zn_x S_{1-y} Se_y$ where the p-doped layer is a ZnSe-based alloy, the graded-composition alloy having a composition of the ZnSe-based alloy adjacent to the p-doped layer and a composition selected from the group consisting of beta-HgS and HgSSe remote from the p-doped layer, and
   a HgZnSeTe-based graded-composition alloy having a composition of $Hg_{1-x} Zn_x Se_{1-y} Te_y$ where the p-doped layer is a ZnTe-based alloy, the graded-composition alloy having a composition of the ZnTe-based alloy adjacent to the p-doped layer and a composition selected from the group consisting of HgSe and HgSeTe remote from the p-doped layer, where, in each case, x and y each vary an amount within the range 0 to 1 inclusive between a location adjacent the p-doped layer and a location remote from the p-doped layer.

13. The device of claim 12, wherein the doped layer is a ZnSe-based alloy.

14. The device of claim 13, wherein the opposition of the graded-composition alloy as a function of distance from the p-doped layer is selected to maintain a substantially constant lattice parameter with decreasing bandgap in a first region extending away from the p-doped layer, and selected to decrease the bandgap without maintaining the lattice parameter constant in a second region extending further from the p-doped layer.

15. The device of claim 12, wherein the p-doped layer is a ZnTe-based alloy.

16. The device of claim 15, wherein the composition of the graded-composition alloy as a function of distance from the p-doped layer is selected to maintain a substantially constant lattice parameter with decreasing bandgap.

17. A device, comprising;
   a p-doped layer having a composition selected from the group consisting of (i) a ZnSe-based alloy and (ii) a ZnTe-based alloy; and
   means for making electrical contact to the p-doped layer, the means including a graded-alloy contact layer in epitaxial contact with the p-doped layer and whose bandgap varies from about that of the p-doped layer adjacent the p-doped layer to about zero at a location remote from the p-doped layer, the graded-alloy contact layer being formed from an alloy selected from the group consisting of (i) a HgZnSSe-based graded-composition alloy having a composition of $Hg_{1-x} Zn_x S_{1-y} Se_y$ where the p-doped layer is a ZnSe-based alloy and (ii) a HgZnSeTe-based graded-composition alloy having a composition of $Hg_{1-x} Zn_x Se_{1-y} Te_y$ where the p-doped layer is a ZnTe-based alloy where, in each case, x and y each vary an amount within the range 0 to 1 inclusive between a location adjacent the p-doped layer and a location remote from the p-doped layer.

18. An ohmic contact to a group II–VI p-type semiconductor, said ohmic contact comprising:
   a first portion of a II–VI alloy having a first composition including a II–VI semimetal, said first portion formed on said group II–VI p-type semiconductor, and a second portion of II–VI material having a second composition including a II–VI semimetal, said second portion being spaced from said group II–VI p-type semiconductor by said first portion, wherein said second composition has a greater amount of II–VI semimetal than said first composition.

19. An ohmic contact to a group II–VI p-type semiconductor, said ohmic contact comprising:
   a II–VI quaternary alloy including a II–VI semimetal in which the proportion of II–VI semimetal increases in a direction away from said group II–VI p-type semiconductor.

20. An ohmic contact to a group II–VI p-type semiconductor, said ohmic contact comprising:
   a II–VI quaternary alloy having a first portion formed on said group II–VI p-type semiconductor and a second portion spaced from said group II–VI p-type semiconductor by said first portion, said II–VI quaternary alloy including a II–VI semimetal in which (1) the proportion of II–VI semimetal increases in a direction away from said group II–VI p-type semiconductor in said first and second portions and (2) the relative proportions of the group VI elements in the II–VI quaternary alloy are varied as the proportion of II–VI semimetal increases in order to maintain a substantially constant lattice parameter in said first portion.

* * * * *